(12) United States Patent
Gayet et al.

(10) Patent No.: US 6,762,497 B2
(45) Date of Patent: Jul. 13, 2004

(54) INTEGRATED CIRCUIT WITH STOP LAYER AND ASSOCIATED FABRICATION PROCESS

(75) Inventors: Philippe Gayet, St. Vincent de Mercuze (FR); Eric Granger, Crolles (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/046,322

(22) Filed: Oct. 23, 2001

(65) Prior Publication Data

US 2002/0079589 A1 Jun. 27, 2002

Related U.S. Application Data

(62) Division of application No. 09/320,201, filed on May 26, 1999, now Pat. No. 6,355,552.

(30) Foreign Application Priority Data

May 27, 1998 (FR) ............................................. 98 06687

(51) Int. Cl.[7] .......................... H01L 23/48; H01L 23/52; H01L 29/40
(52) U.S. Cl. .......................... 257/758; 257/760; 257/762
(58) Field of Search ................................. 257/758, 760, 257/762

(56) References Cited

U.S. PATENT DOCUMENTS

| | | | |
|---|---|---|---|
| 5,110,712 A | | 5/1992 | Kessler et al. |
| 5,244,837 A | | 9/1993 | Dennison |
| 5,321,211 A | * | 6/1994 | Haslam et al. ............... 174/262 |
| 5,371,047 A | * | 12/1994 | Greco et al. ................. 437/238 |
| 5,451,543 A | | 9/1995 | Woo et al. |
| 5,598,027 A | | 1/1997 | Matsuura |
| 5,817,574 A | | 10/1998 | Gardner |
| 5,834,845 A | | 11/1998 | Stolmeijer |
| 5,891,799 A | * | 4/1999 | Tsui ............................ 438/624 |
| 5,935,868 A | | 8/1999 | Fang et al. |
| 5,981,377 A | * | 11/1999 | Koyama ...................... 438/633 |
| 6,020,255 A | | 2/2000 | Tsai et al. |
| 6,048,787 A | | 4/2000 | Lee |

OTHER PUBLICATIONS

Patent Abstract of Japanese publication No. 08241924 dated Sep. 17, 1996.
French Search Report dated Feb. 9, 1999 with annex on French Application No. 9806687.

* cited by examiner

Primary Examiner—Phat X. Cao
(74) Attorney, Agent, or Firm—Lisa K. Jorgenson; Stephen Bongini; Fleit, Kain, Gibbons, Gutman, Bongini & Bianco P.L.

(57) ABSTRACT

A method for fabricating an integrated circuit. According to the method, a second dielectric layer is formed above a first dielectric layer, and holes and/or trenches are etched in the first and second dielectric layers. The holes and/or trenches are filled with metal in order to form electrical connection elements, and at least a third dielectric layer is formed. Holes and/or trenches are selectively etched in the third dielectric layer and the second dielectric layer with respect to the first dielectric layer and the elements, in order to control the depth of the etch. Additionally, there is provided an integrated circuit of the type having metallization levels separated by dielectric layers and metallized vias connecting lines of different metallization levels. The integrated circuit includes first and second metallization levels, first and second superposed dielectric layers located above the first metallization level, and a third dielectric layer located above the first and second dielectric layers. Further, at least one electrical connection element is provided in the third dielectric layer and passes through the second dielectric layer until it comes into contact with the first dielectric layer.

10 Claims, 3 Drawing Sheets

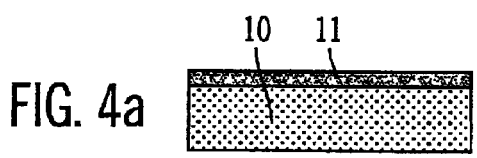
FIG. 4a
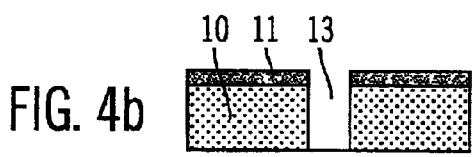
FIG. 4b
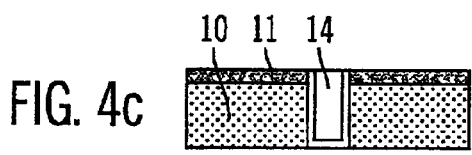
FIG. 4c
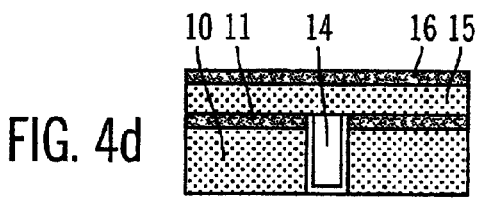
FIG. 4d
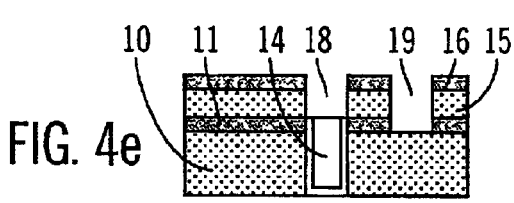
FIG. 4e
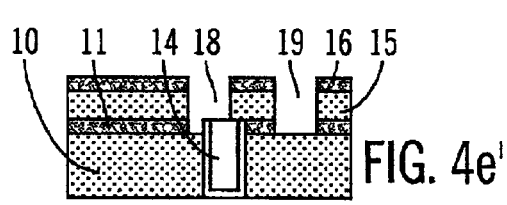
FIG. 4e'
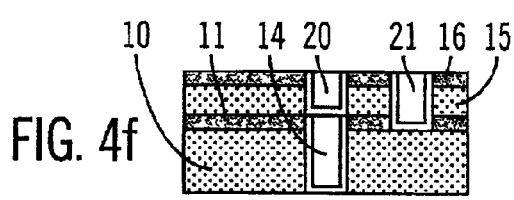
FIG. 4f
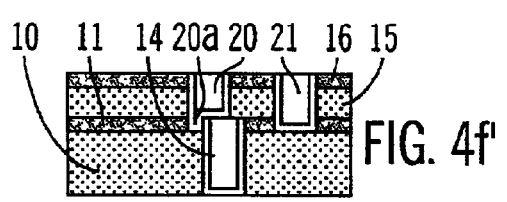
FIG. 4f'
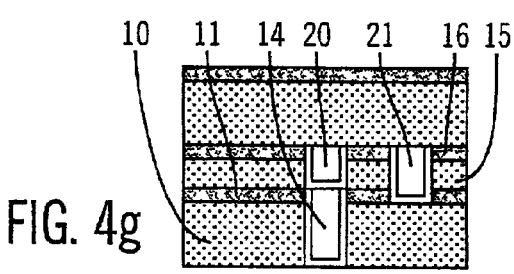
FIG. 4g
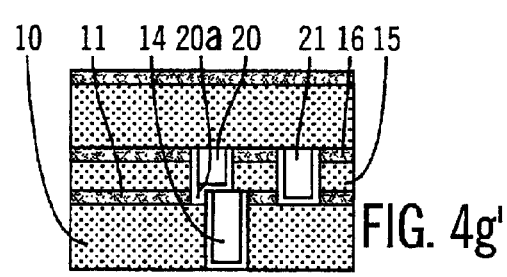
FIG. 4g'
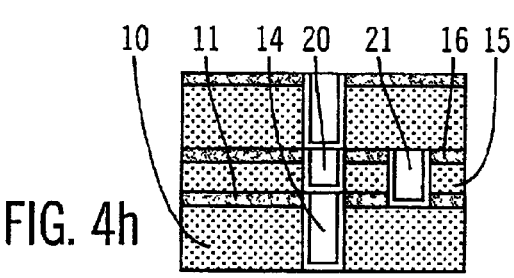
FIG. 4h
FIG. 4h'

INTEGRATED CIRCUIT WITH STOP LAYER AND ASSOCIATED FABRICATION PROCESS

CROSS-REFERENCE TO RELATED APPLICATIONS

This application is a DIV of Ser. No. 09/320,201, filed May 26, 1999, U.S. Pat. No. 6,355,552.

This application is based upon and claims priority from prior French Patent Application No. 98-06687, filed May 27, 1998, the entire disclosure of which is herein incorporated by reference.

BACKGROUND OF THE INVENTION

1. Field of the Invention

The present invention relates to integrated circuits, and more specifically to semiconductor integrated circuits having a stack of conducting layers separated by insulating layers.

2. Description of Related Art

In conventional integrated circuits, electrical connections must be made between conducting metallized layers that are on different levels and separated by one more insulating layers. In a conventional manufacturing process, two conducting layers are electrically connected through vias, which are holes in the insulating layer that are filled with metal. In order to reduce the width of the metal lines of a conducting metallized layer, lines having a width equal to the width of the vias are used.

This type of integrated circuit can be produced using the "Damascene" process in which a first insulating layer is deposited on a metallization layer of level n and holes are etched through the insulating layer. The metal for the via is then deposited and polished until it is level with the upper surface of the insulating layer, and then a new insulating layer is deposited on the formed via of level n. The trenches for the lines are etched, metal for the lines of the metallization layer is deposited and then polished until it is level with the upper surface of the insulating layer, and so on. A via normally has to be precisely positioned on a line, and a line of the subsequent metallization level normally has to be precisely positioned on the via.

However, due to the alignment tolerances of the machines for photoetching the holes and trenches in which the vias and lines are formed, an offset can occur (e.g., of about one-third of the width of a hole or trench). Thus, when etching an insulating layer, the existing via or line in the lower insulating layer does not form an etching stop barrier over the entire surface of the trench or hole during the etching process. As a result, the etching can be carried out in the lower layer on one side of the via or line without any accurate control of the depth of the hole in the lower insulating layer. When the hole in the upper layer is then filled with metal, the contact area between the via and line is not accurately known and thus the electrical resistance between these two elements is not easily known. With respect to the lines, the depth of the trenches cannot be reproducibly controlled so there is a spread in line resistances.

There is another conventional process differing slightly from the one described above that seeks to control the depth of the trenches by avoiding lateral contact between vias and lines of different levels. In this process, a "stop layer" is placed on the lower insulating layer. The holes in the stop layer and in the lower insulating layer are etched, the holes are filled with metal and polished, and then an upper insulating layer and an upper stop layer are deposited. The hole in the upper insulating layer is etched using a process that is incapable of etching the lower stop layer so the etching stops on the upper surface of the stop layer.

The etching is begun using a process that is capable of etching each stop layer. Because the thickness of the stop layers is relatively small compared with the associated insulating layers, it is possible to interrupt the etching before the entire thickness of the associated insulating layer has been etched. The etching is selectively stopped with respect to the stop layer and the associated metallization level. Thus, the hole in the upper insulating layer is bounded by the upper surface of the lower stop layer and the metallization level or associated vias. As a result, the etching depth of a hole or trench is controlled satisfactorily, even when there is an offset between the vias and the lines of two adjacent layers. However, when there is such an offset, the contact area between a via and a line in superposition can be lessened so as to cause an increase in the electrical resistance between these two elements.

SUMMARY OF THE INVENTION

In view of these drawbacks, it is an object of the present invention to overcome the above-mentioned drawbacks and to provide a process that makes it possible to both control the etching depth and obtain contact areas that are sufficiently large and relatively constant. In the process, a second dielectric layer is formed above a first dielectric layer, and holes and/or trenches are etched in the first and second dielectric layers. The holes and/or trenches are filled with metal in order to form electrical connection elements, and at least a third dielectric layer is formed. Holes and/or trenches are selectively etched in the third dielectric layer and the second dielectric layer with respect to the first dielectric layer and the elements, in order to control the depth of the etch. If there is an offset between vias or lines in superposition, a lateral contact between these two elements can be made within the thickness of the dielectric layer placed under the third dielectric layer while at the same time controlling the depth of the trenches (or of the elements in general). Thus, it is possible to keep the contact area between these two elements substantially constant so as to improve the integrated circuit by taking advantage of a characteristic that constituted a defect in conventional circuits.

Another object of the present invention is to provide an integrated circuit having substantially constant electrical resistance between superposed vias. The integrated circuit is of the type having metallization levels separated by dielectric layers and metallized vias connecting lines of different metallization levels. Additionally, the integrated circuit includes first and second metallization levels, first and second superposed dielectric layers located above the first metallization level, and a third dielectric layer located above the first and second dielectric layers. At least one electrical connection element is provided in the third dielectric layer and passes through the second dielectric layer until it comes into contact with the first dielectric layer. Because the metallized elements have a lateral surface adjacent to their upper surface, at least one element, via, or line includes a portion level with the adjacent dielectric layer below the third layer, in contact with the lateral surface of the corresponding element provided in the two layers. Thus, the thickness of the lines and their electrical resistance are satisfactorily controlled.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIGS. 4a through 4h and 4e' through 4h' are sectional views showing integrated circuit fabrication according to another embodiment of the present invention.

DETAILED DESCRIPTION OF PREFERRED EMBODIMENTS

Preferred embodiments of the present invention will be described in detail hereinbelow with reference to the attached drawings.

Figure 1:
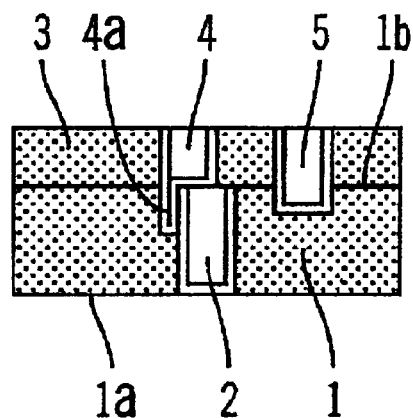
FIG. 1 is a sectional view of a conventional integrated circuit.

FIG. 1 shows a conventional integrated circuit. As shown, a lower dielectric layer 1 is provided with a via 2 that passes through its thickness to provide electrical connection between a metallization level adjacent to its lower face 1a and a metallization level adjacent to its upper face 1b. An upper dielectric layer 3 that covers the upper face 1b of the lower dielectric layer 1 is provided with two lines 4 and 5. The lines 4 and 5 are placed in trenches that are etched in the thickness of the upper dielectric layer 3 to form a metallization level. To guarantee that the trenches are deep enough to reach the upper face 1b, the etching step is continued for long enough to be sure that this level has been reached. Thus, part of the thickness of the lower layer 1 is also etched. However, the thickness of the lower layer that is etched is not accurately known.

Frequently, the vias and lines of the two superposed dielectric layers are offset. For example, line 4 is shown offset with respect to the via 2 by approximately one-third of its width. During the etching of the trench for the lines 4 and 5, the via 2 stops the etching. Nevertheless, because of the offset, the etching continues on the side of the via 2 to a depth that cannot be accurately controlled. Similarly, the depth of the trench 5 also cannot be controlled.

During the deposition of the metal for the lines 4 and 5, the portion of the hole on the side of the via 2 is also filled with metal so as to form a portion 4a of the line 4 that lies below the upper surface 1b of the lower layer 1 adjacent to the via 2. Because the thickness etched in the lower layer 1 during the etching of the upper layer 3 and consequently the thickness of the line portion 4a are not accurately known, the contact area between the via 2 and the line 4 also cannot be accurately known because contact takes place not only through the surfaces of the via 2 and the line 4 that are flush with the upper face 1b of the lower layer 1, but also through the edge of the via 2 and the line portion 4a.

Figure 2:
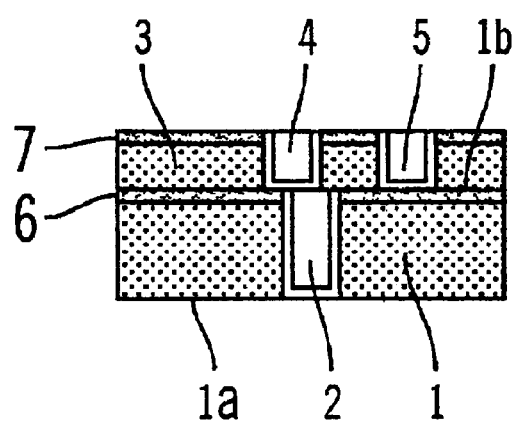
FIG. 2 is a sectional view of another conventional integrated circuit.

FIG. 2 shows another conventional integrated circuit. This integrated circuit has a stop layer 6 deposited on the upper surface 1b of the lower layer 1 to support a metallization level (not shown). The stop layer 6 can be composed of nitride, with the dielectric layer 1 composed of silicon oxide. Further, the stop layer 6 can be composed of high-density silicon oxide, with the dielectric layer 1 composed of an insulator having a lower electrical permittivity. In general, the stop layer 6 is composed of a material that cannot be etched while an adjacent dielectric layer is being etched.

The via 2 is deposited in the thickness of the lower layer 1 and stop layer 6. The upper dielectric layer 3 also receives a stop layer 7, with the lines 4 and 5 being deposited through the upper layer 3 and the stop layer 7. When the stop layer 7 and the upper layer 3 are being etched, a process capable of etching the stop layer 7 is first used. After the stop layer 7 has been etched, another process capable of selectively etching the upper dielectric layer 3 with respect to the via 2 and the stop layer 6 is used. Thus, the etching stops on a plane surface formed by the stop layer 6 and the via 2.

When there is an offset between the holes and vias of two adjacent superposed layers, the contact between the via 2 and the line 4 takes place only over a plane surface that is common to the via 2 and the line 4. Consequently, the contact surface has a smaller area than the area of one of those two elements. Although the depth of the lines is controlled, this reduction in contact area between the via 2 and the line 4 results in an increase in the electrical resistance, to the detriment of the proper operation of the integrated circuit.

Figure 3A:
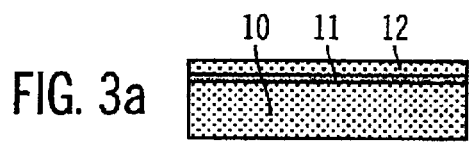
FIGS. 3a through 3h and 3e' through 3h' are sectional views showing integrated circuit fabrication according to one embodiment of the present invention.
Figure 3B:
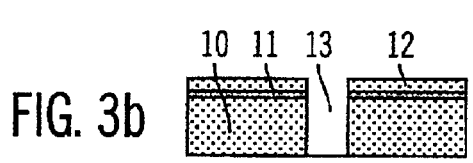
Figure 3C:
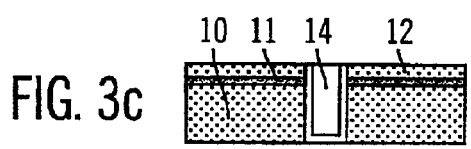
Figure 3D:
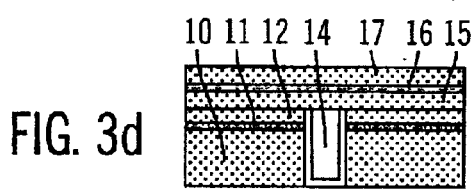
Figure 3E:
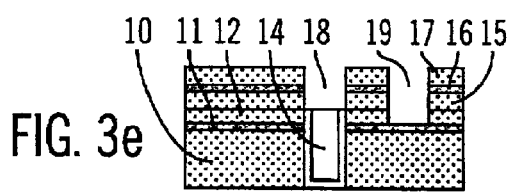
Figure 3E:
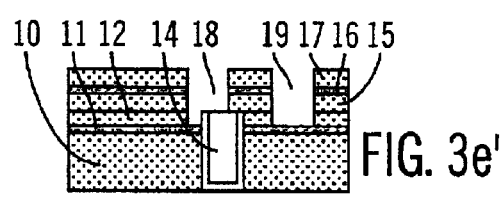

FIGS. 3a through 3h (and 3e' to 3h') show integrated circuit fabrication according to one embodiment of the present invention. As shown, the process begins (FIG. 3a) with the deposition of a first dielectric layer 10 on a metallization layer (not shown) of level n. Next, a second dielectric layer 11 of small thickness (compared to the dielectric layer 10) is deposited as a stop layer. An additional dielectric layer 12 of small thickness is then deposited on the stop layer 11. Next (FIG. 3b), holes 13 are etched using a process capable of etching the dielectric layers 10, 11, and 12 (or using a succession of processes). The hole 13 is filled with metal to form a via 14 (FIG. 3c), and then a third dielectric layer 15, a fourth dielectric layer 16, and an additional dielectric layer 17 are deposited on the additional dielectric layer 12 and the via 14 (FIG. 3d).

Figure 3F:
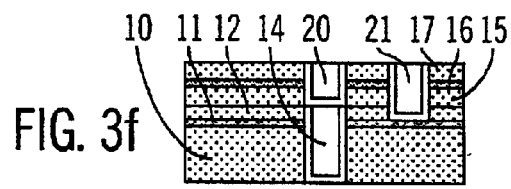
Figure 3F:
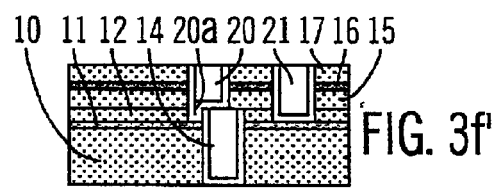
Figure 3G:
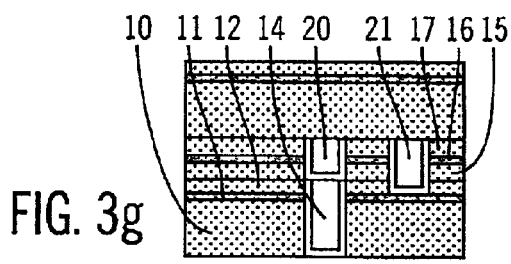
Figure 3G:
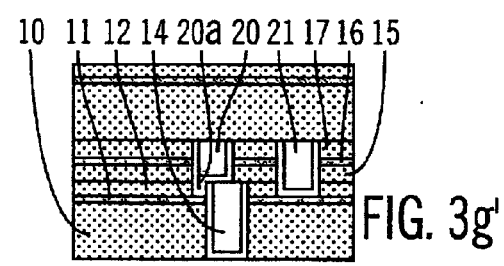
Figure 3H:
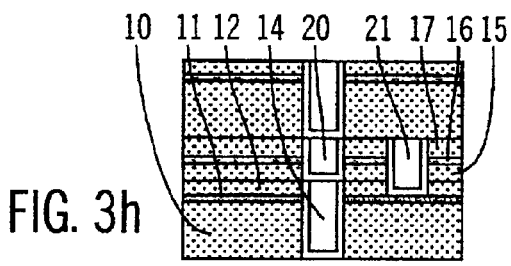
Figure 3H:
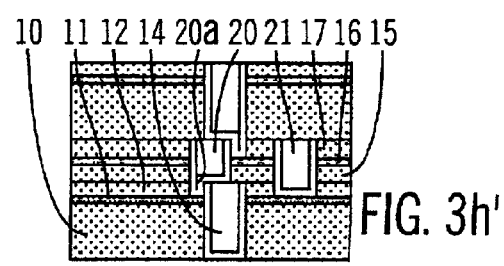

Next (FIG. 3e), the additional dielectric layer 17 and the fourth dielectric layer 16 are non-selectively etched, and then the third dielectric layer 15 and the additional dielectric layer 12 are selectively etched with respect to the second dielectric layer 11. Thus, trenches 18 and 19 are obtained. In the absence of an offset, the trench 18 stops at the upper end of the via 14 and the trench 19 stops at the second dielectric layer 11. The trenches 18 and 19 are filled with metal in order to form lines 20 and 21 (FIG. 3f). This process is preferably repeated in a similar manner in order to form a stack of metallization levels that are separated by dielectric layers (FIGS. 3g and 3h). The thickness of the dielectric layers can vary depending on the metallization level.

On the other hand, if there is an offset (FIG. 3e'), the etching of the trench 18 stops partially at the via 14 and partially at the second dielectric layer 11. The depth of the additional etching between the via 14 and the second dielectric layer 11 is known to be equal to the thickness of the additional dielectric layer 12. Next, metal is deposited in the trenches 18 and 19 in order to form the lines 20 and 21 (FIG. 3f). The line 20 includes a portion 20a that extends over the thickness of the additional dielectric layer 12 on a lateral surface of the via 14, adjacent to the end surface of the via 14. Contact between the via 14 and the line 20 takes place through both the end and the adjacent lateral surface of the via 14 over an always constant height of the lateral surface. Thus, the contact area between the via 14 and the line 20 is accurately known so that the resistance between the via 14 and the line 20 is also accurately known. Further, the depth of the line 21 and its resistance are also known. As explained above, these steps are preferably repeated in order to obtain an integrated circuit having a large number of layers (FIGS. 3g' and 3h').

FIGS. 4a to 4h (and 4e' to 4h') show integrated circuit fabrication according to another embodiment of the present invention. In this embodiment, the first dielectric layer 10 is covered with a thick second dielectric layer 11 that forms a stop layer (FIG. 4a). The second dielectric layer 11 and the fist dielectric layer 10 are etched (FIG. 4b) in order to obtain a hole 13 that is filled with metal to form a via 14 (FIG. 4c). Then, a third dielectric layer 15 and a fourth dielectric layer 16 are deposited on the second dielectric layer 11 and the metallization level n+1 (FIG. 4d). The fourth dielectric layer 16 and the third dielectric layer 15 are non-selectively etched, the third dielectric layer 15 is selectively etched with respect to the second dielectric layer 11, and then the second dielectric layer 11 is selectively etched with respect to the first dielectric layer 10 (FIG. 4e).

Thus, trenches 18 and 19 in a configuration similar to that of FIGS. 3a through 3h (with or without an offset) are obtained. The trenches 18 and 19 can then be filled with metal to form the lines 20 and 21 (FIG. 3f), with the process being preferably repeated for subsequent layers so as to form an integrated circuit having multiple metallization levels. The structure of the integrated circuit of FIGS. 4a through 4h is simpler than the integrated circuit of FIGS. 3a to 3h because the intermediate dielectric layer between the two metallization levels is omitted. On the other hand, the second dielectric layer 11 is thicker, and this can increase stray interline capacitances.

Accordingly, the present invention provides an integrated circuit in which the resistances of the superposed vias and lines are satisfactorily controlled. Thus, it is possible to enhance the performance of the integrated circuit and to improve quality by reducing the number of defects. Further, the fabrication process for forming such an integrated circuit is relatively simple and can be carried out using existing fabrication machines.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, other embodiments of the present invention may not include all of the features described above. Therefore, it is intended that the present invention not be limited to the particular embodiments disclosed, but that the invention include all embodiments falling within the scope of the appended claims.

What is claimed is:

1. An integrated circuit of the type having metallization levels separated by dielectric layers and metallized vias connecting lines of different metallization levels, said integrated circuit comprising:

at least first and second metallization levels;

at least first and second superposed dielectric layers located above the first metallization level;

a third dielectric layer located above the first and second dielectric layers;

at least one electrical connection element provided in the third dielectric layer and passing through the second dielectric layer until it comes into contact with the first dielectric layer; and at least one metallized via having an upper surface that is flush with an upper surface of the second dielectric layer.

2. The integrated circuit as defined in claim 1, wherein the metallized via has a lateral surface adjacent to its upper surface, and the electrical connection element includes one portion that is in contact with the upper surface of the metallized via and another portion at the level of the second dielectric layer that is in contact with the lateral surface of the metallized via.

3. An integrated circuit of the type having metallization levels separated by dielectric layers and metallized vias connecting lines of different metallization levels, said integrated circuit comprising:

at least first and second metallization levels;

at least first and second superposed dielectric layers located above the first metallization level, the first dielectric layer being located on the first metallization level;

a third dielectric layer located above the first and second dielectric layers;

at least one electrical connection element provided in the third dielectric layer and passing through the second dielectric layer until it comes into contact with the first dielectric layer; and at least one metallized via having an upper surface that is flush with an upper surface of the second dielectric layer.

4. The integrated circuit as defined in claim 3, further comprising:

a third metallization level;

at least fourth and fifth superposed dielectric layers located above the second metallization level;

a sixth dielectric layer located above the fourth and fifth dielectric layers; and at least one additional electrical connection element provided in the sixth dielectric layer and passing through the fifth dielectric layer until it comes into contact with the fourth dielectric layer.

5. The integrated circuit as defined in claim 4, wherein the metallized via has a lateral surface adjacent to its upper surface, and the electrical connection element includes one portion that is in contact with the upper surface of the metallized via and another portion at the level of the second dielectric layer that is in contact with the lateral surface of the metallized via.

6. The integrated circuit as defined in claim 3, wherein the metallized via has a lateral surface adjacent to its upper surface, and the electrical connection element includes one portion that is in contact with the upper surface of the metallized via and another portion at the level of the second dielectric layer that is in contact with the lateral surface of the metallized via.

7. The integrated circuit as defined in claim 4, wherein the fourth dielectric layer is located on the second metallization level.

8. An integrated circuit of the type having metallization levels separated by dielectric layers and metallized vies connecting lines of different metallization levels, said integrated circuit comprising:

at least first and second metallization levels;

at least first and second superposed dielectric layers located above the first metallization level;

a third dielectric layer located above the first and second dielectric layers;

at least one electrical connection element provided in the third dielectric layer and passing through the second dielectric layer until it comes into contact with the first dielectric layer;

a third metallization level;

at least fourth and fifth superposed dielectric layers located above the second metallization level;

a sixth dielectric layer located above the fourth and fifth dielectric layers;

at least one additional electrical connection element provided in the sixth dielectric layer and passing through the fifth dielectric layer until it comes into contact with the fourth dielectric layer; and at least one additional metallized via having an upper surface that is hush with an upper surface of the second dielectric layer.

9. The integrated circuit as defined in claim 8, wherein the metallized via has a lateral surface adjacent to its upper surface, and the electrical connection element includes one portion that is in contact with the upper surface of the metallized via and another portion at the level of the second dielectric layer that is in contact with the lateral surface of the metallized via.

10. The integrated circuit as defined in claim 8, wherein the fourth dielectric layer is located on the second metallization level.

* * * * *